United States Patent
Grenouillet et al.

(10) Patent No.: US 9,570,340 B2
(45) Date of Patent: Feb. 14, 2017

(54) METHOD OF ETCHING A CRYSTALLINE SEMICONDUCTOR MATERIAL BY ION IMPLANTATION AND THEN CHEMICAL ETCHING BASED ON HYDROGEN CHLORIDE

(71) Applicant: COMMISSARIAT A L'ENERGIE ATOMIQUE ET AUX ENE ALT, Paris (FR)

(72) Inventors: Laurent Grenouillet, Rives (FR); Maud Vinet, Rives (FR); Romain Wacquez, Marseilles (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/426,029

(22) PCT Filed: Sep. 4, 2013

(86) PCT No.: PCT/EP2013/068299
§ 371 (c)(1),
(2) Date: Mar. 4, 2015

(87) PCT Pub. No.: WO2014/037410
PCT Pub. Date: Mar. 13, 2014

(65) Prior Publication Data
US 2015/0214099 A1    Jul. 30, 2015

(30) Foreign Application Priority Data
Sep. 5, 2012 (FR) .................................. 12 58263

(51) Int. Cl.
*H01L 21/762* (2006.01)
*B82Y 40/00* (2011.01)
(Continued)

(52) U.S. Cl.
CPC ......... *H01L 21/76283* (2013.01); *B82Y 40/00* (2013.01); *H01L 21/266* (2013.01);
(Continued)

(58) Field of Classification Search
CPC ............. H01L 21/76283; H01L 21/266; H01L 21/302; H01L 21/30604; H01L 21/3065; H01L 21/76232; H01L 29/42384; H01L 29/66772; H01L 29/78654; B82Y 40/00
(Continued)

(56) References Cited

U.S. PATENT DOCUMENTS 5,736,435 A    4/1998  Venkatesan et al.
6,313,008 B1 *  11/2001  Leung ............... H01L 21/76232
                                                          257/510
(Continued)

FOREIGN PATENT DOCUMENTS

JP    S59194438 A  *  5/1984  ........... H01L 21/306
JP    62 89324           4/1987
(Continued)

OTHER PUBLICATIONS

U.S. Appl. No. 14/426,007, filed Mar. 4, 2015, Grenouillet, et al.
(Continued)

*Primary Examiner* — Fernando L Toledo
*Assistant Examiner* — Adam S Bowen
(74) *Attorney, Agent, or Firm* — Oblon, McClelland, Maier & Neustadt, L.L.P.

(57) ABSTRACT

The invention provides a method of etching a crystalline semiconductor material (114), the method being characterized in that it comprises: at least one ion implantation performed by implanting a plurality of ions (121) in at least one volume (113) of the semiconductor material (114) in such a manner as to make the semiconductor material amorphous in the at least one implanted volume (113), and
(Continued)

as to keep the semiconductor material (114) in a crystalline state outside (112) the at least one implanted volume (113); and at least one chemical etching for selectively etching the amorphous semiconductor material relative to the crystalline semiconductor material, so as to remove the semiconductor material in the at least one volume (113) and so as to keep the semiconductor material outside (112) the at least one volume (113).

17 Claims, 10 Drawing Sheets

(51) Int. Cl.
  *H01L 21/302* (2006.01)
  *H01L 21/306* (2006.01)
  *H01L 21/3065* (2006.01)
  *H01L 29/66* (2006.01)
  *H01L 29/423* (2006.01)
  *H01L 29/786* (2006.01)
  *H01L 21/266* (2006.01)

(52) U.S. Cl.
  CPC ........ *H01L 21/302* (2013.01); *H01L 21/3065* (2013.01); *H01L 21/30604* (2013.01); *H01L 21/76232* (2013.01); *H01L 29/42384* (2013.01); *H01L 29/66772* (2013.01); *H01L 29/78654* (2013.01)

(58) Field of Classification Search
  USPC .......................................................... 438/424
  See application file for complete search history.

(56) References Cited

U.S. PATENT DOCUMENTS

| | | |
|---|---|---|
| 7,550,359 B1 | 6/2009 | Cheng et al. |
| 2004/0248348 A1* | 12/2004 | Rausch ............... H01L 21/3065 438/197 |
| 2005/0085022 A1* | 4/2005 | Chidambarrao H01L 21/823807 438/151 |
| 2005/0139930 A1 | 6/2005 | Chidambarrao et al. |
| 2007/0057326 A1 | 3/2007 | Morikado |
| 2007/0190787 A1 | 8/2007 | Loubet et al. |
| 2007/0254441 A1 | 11/2007 | Wei et al. |
| 2009/0280627 A1* | 11/2009 | Pal .................... H01L 21/26506 438/504 |
| 2010/0181619 A1 | 7/2010 | Wei et al. |
| 2011/0097824 A1* | 4/2011 | Berliner ................ H01L 21/302 438/14 |
| 2011/0147841 A1 | 6/2011 | Morikado |
| 2011/0233550 A1* | 9/2011 | Takasawa ........... C23C 14/0036 257/57 |
| 2012/0056258 A1 | 3/2012 | Chen |
| 2012/0119302 A1* | 5/2012 | Pei .................... H01L 21/76879 257/382 |
| 2012/0125538 A1 | 5/2012 | Berliner et al. |

FOREIGN PATENT DOCUMENTS

| | | | | |
|---|---|---|---|---|
| JP | S6289324 A | * | 4/1987 | .......... H01L 21/205 |
| JP | 59 194438 | | 11/1987 | |

OTHER PUBLICATIONS

Lee, K. et al., "Fabrication of Suspended Silicon Nanowire Arrays", SMALL, vol. 4, No. 5, pp. 642-648, (May 2008), XP002695862.
Bauer, M. et al., "Low temperature catalyst enhanced etch process with high etch rate selectivity for amorphous silicon based alloys over single-crystalline silicon based alloys", Thin Solid Films, vol. 520, No. 8, pp. 3139-3143, (Feb. 1, 2012), XP002695863.
Loubet, N. et al., "Silicon Etching Study in a RT-CVD Reactor with the HCl/H2 Gas Mixture", Mater. Res.Soc. Symp. Proc., vol. 910, Total 6 Pages, (Apr. 18, 2006), XP055062215.
International Search Report Issued Oct. 23, 2013 in PCT/EP13/068299 Filed Sep. 4, 2013.
International Search Report Issued Nov. 15, 2013 in PCT/EP13/068300 Filed Sep. 4, 2013.

* cited by examiner

METHOD OF ETCHING A CRYSTALLINE SEMICONDUCTOR MATERIAL BY ION IMPLANTATION AND THEN CHEMICAL ETCHING BASED ON HYDROGEN CHLORIDE

CROSS REFERENCE TO RELATED APPLICATIONS

The present application is a 35 U.S.C. §371 national stage patent application of International patent application PCT/EP2013/068299, filed on Sep. 4, 2013, published as WO/2014/037410 on Mar. 13, 2013, the text of which is incorporated by reference, and claims the benefit of the filing date of French application no. 12 58263, filed on Sep. 5, 2012, the text of which is also incorporated by reference.

TECHNICAL FIELD OF THE INVENTION

The present invention relates to a microelectronic method for selectively etching a homogeneous semiconductor material, such as silicon, for example.

The invention has various particularly advantageous applications, including to methods of etching in three dimensions, i.e. in directions that are not perpendicular to a plane of the substrate to be etched.

STATE OF THE ART

Known methods of etching silicon or silicon-based alloys conventionally comprise either plasma etching of the Reactive Ion Etching (RIE) type, or anisotropic or isotropic etching of the chemical type.

One of the difficulties with such etching lies in controlling the etched thickness. The ever smaller sizes of microelectronic devices requires ever better control over the etched thickness, such control being essential.

Thus, usually an etch stop layer is used to control the end of etching. Such a stop layer is disposed under the layer that is to be etched. The etch stop layer and the layer to be etched are of different chemical compositions, and the speed at which the stop layer is etched is much lower than the speed at which the layer to be etched is etched.

For a silicon layer to be etched, it is possible, for example, to provide an etch stop layer made of silicon oxide $SiO_2$.

Those solutions suffer from the drawback of requiring an etch stop layer, which can be restrictive for certain structures or for certain methods of producing structures. In addition, etching with an etch stop layer precludes etching in three dimensions or in directions that are not perpendicular to the plane of the substrate on which the layer to be etched is disposed, or makes such etching difficult.

If an etch stop layer, e.g. a stop layer made of $SiO_2$, is deposited for etching silicon, it can be difficult or indeed impossible to obtain monocrystalline silicon above such an etch stop layer, because such silicon has to be deposited and is thus amorphous or polycrystalline.

In general, the use of an etch stop layer also makes the structure more complex (and therefore more costly), and can adversely affect or change the way it operates electrically or optically, etc.

In order to avoid needing an etch stop layer, certain solutions make provision for controlling the etching time on the basis of an estimation of the instant at which the etching should be interrupted. However, in view of the size of the wafer, and of the non-homogeneity of the etching due to the non-homogeneity of the plasma, for example, the etched thickness is rarely uniform. When an etch stop layer is used, that non-homogeneity of the wafer and the non-homogeneity of the etching conditions are solved by overetching so as to be certain that all of the material to be etched has indeed been removed. Such overetching is to approximately in the range 10% to 50% depending on the materials and on the selectivity relative to the etch stop layer. In the absence of an etch stop layer, such non-homogeneities of the wafer and of the etching conditions generally give rise to non-homogeneities in the result of the etching.

Furthermore, chemical etching, isotropic etching, and anisotropic etching offer limited possibilities in the resulting etching patterns. Typically, they only make it possible to obtain etching in a direction that is perpendicular to the plane of the wafer, or in crystalline planes of the material to be etched. In addition; they suffer from major drawbacks, such as having a "loading effect" or "capillary action effect". Such effects are related, in particular, to the non-homogeneity of the bath. The etching bath has non-homogeneous distributions of concentration and/or of temperature. Thus, in practice the etching depth is highly dependent on the cross-sections of the patterns to be etched. The loading effect or capillary action effect also causes inclined walls or ramps to appear even though vertical walls are desired.

Isotropic or anisotropic etching of the chemical type thus suffers from drawbacks in terms of accuracy of definition of the patterns, and in terms of freedom regarding the shapes of the patterns to be etched.

US Patent Application published under No. US_A1_20070190787 proposes a method of etching that is in common use in Silicon On Nothing (SON) technology applications. That solution is based on using hydrogen chloride to etch a silicon-germanium (SiGe) layer selectively relative to a silicon (Si) layer.

That method suffers from the drawback that the etching takes place in a direction perpendicular to the plane of the substrate. In other words, that method does not make it possible for zones of varied shapes to be formed easily. Moreover, before it can be implemented, that solution requires a stack of different layers to be formed that have different etching kinetics.

The above paragraphs indicate numerous drawbacks that are suffered by known etching solutions. An object of the invention is to reduce, or to offer a solution to, at least some of those drawbacks.

SUMMARY OF THE INVENTION

The present invention enables the drawbacks of the currently known techniques to be remedied fully or partially.

In particular, in one aspect, the invention provides a method of etching a crystalline semiconductor material, the method comprising: at least one ion implantation performed by implanting a plurality of ions in at least one volume of the semiconductor material in such a manner as to make the semiconductor material amorphous in the at least one implanted volume, and as to keep the semiconductor material in a crystalline state outside the at least one implanted volume; and at least one chemical etching for selectively etching the amorphous semiconductor material relative to the crystalline semiconductor material, so as to remove the semiconductor material in the at least one volume and so as to keep the semiconductor material outside the at least one volume.

Thus, the method combines ion implantation for accurately defining the portion(s) made amorphous and etching with hydrogen chloride for etching the portions made amorphous with very good selectivity relative to the portions that remain crystalline. The invention thus makes it possible to define the etched portion(s) with very good accuracy. In addition, the etched zones have very good homogeneity. In particular, loading effects or capillary action effects are considerably attenuated or even eliminated. In addition, the invention offers the advantage of enabling etching to be fast.

Furthermore, the shapes of the etched portions depends closely on the direction and on the depth of the implantation. The shapes of the etched portions can thus be freely adapted. In particular, the invention makes it possible to form etched patterns that are inclined relative to the perpendicular to the plane in which the semiconductor material extends.

In addition, the invention does not require the presence of an etch stop layer. Furthermore, it does not require a substrate to be formed that is non-homogeneous and that has various compositions, such as a substrate comprising silicon and silicon-germanium.

In preferred but non-limiting manner, the amorphization is obtained by ion implantation.

In preferred but non-limiting manner, the chemical etching is based on hydrogen chloride in gas phase.

In another aspect, the present invention provides an optical grating made by implementing the method of the invention.

In another aspect, the present invention provides nanowires based on silicon and made by implementing the method of the invention.

In another aspect, the present invention provides a Field-Effect Transistor of the Fully Depleted Silicon On Insulator (FDSOI) type made by implementing the method of the invention.

In another implementation, the invention provides a method of etching a crystalline material, the method comprising:

at least one amorphization of at least one volume of the semiconductor material in such a manner as to make the semiconductor material amorphous in the at least one implanted volume, and as to keep the semiconductor material in a crystalline state outside the at least one implanted volume; and at least one selective etching for selectively etching the amorphous semiconductor material relative to the crystalline semiconductor material, so as to remove the semiconductor material in the at least one volume and so as to keep the semiconductor material outside the at least one volume.

In preferred but non-limiting manner, the amorphization is performed by implanting a plurality of ions in said at least one volume.

In preferred but non-limiting manner, the chemical etching is based on hydrogen chloride in gas phase.

BRIEF DESCRIPTION OF THE FIGURES

The objects, characteristics, and advantages of the invention appear more clearly from the detailed description of an implementation of the invention that is shown in the following accompanying drawings, in which:

FIGS. 5a and 5c are section views of a substrate before and after implementation of the method;

FIGS. 6a and 6c are section views of a substrate before and after implementation of the method; FIG. 7g shows the transistor as formed.

Figure 1:
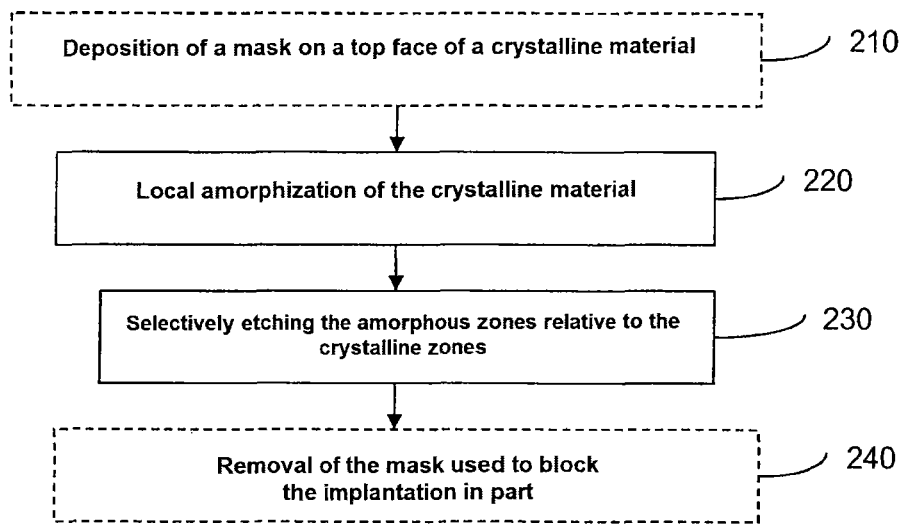
FIG. 1 summarizes the main steps in an implementation of an etching method of the invention.

The accompanying drawings are given by way of example and they are not limiting on the invention. All of the figures of the drawings are diagrammatic representations showing principles and they are not necessarily to scale with respect to the practical applications. In particular, the thicknesses of the substrates and the thicknesses of the various layers making up the devices described, and the etched depths are not representative of reality.

DETAILED DESCRIPTION

It is specified that, in the context of the present invention, the terms "on", "overlying", or "underlying", or their equivalents do not necessarily mean "in contact with". Thus, for example, deposition of a first layer on a second layer does not necessarily mean that the two layers are directly in contact with each other, but rather it means that the first layer covers the second layer at least in part, either while being directly in contact with it, or while being separated from it by another layer or by another element.

It is recalled that, in one implementation, the invention relates to a method of etching a crystalline semiconductor material, the method comprising: at least one ion implantation performed by implanting a plurality of ions in at least one volume of the semiconductor material in such a manner as to make the semiconductor material amorphous in the at least one implanted volume, and as to keep the semiconductor material in a crystalline state outside the at least one implanted volume; and at least one chemical etching for selectively etching the amorphous semiconductor material relative to the crystalline semiconductor material, so as to remove the semiconductor material in the at least one volume and so as to keep the semiconductor material outside the at least one volume.

Before beginning a detailed review of the implementations of the invention, optional characteristics are given below that may be used in association or in alternation:

the crystalline semiconductor material forms a layer extending in a plane, and the ion implantation is mainly, and preferably exclusively, performed in at least one direction that is inclined relative to the perpendicular to said plane;

the implantation is performed over a depth of the semiconductor material lying in the range one-third of to once the maximum amplitude of the relief of the surface roughness of the semiconductor material. The implantation is performed in such a manner that all of the crystalline semiconductor material that is situated above said depth is implanted and made amorphous, and in such a manner as to keep in the crystalline state the semiconductor material that is situated below said depth. Thus, the selective etching method makes it possible to smooth the surface of the semiconductor material.

Preferably, the implantation is performed in at least two directions that are inclined relative to the perpendicular to said plane. These two directions are inclined on either side of the perpendicular to said plane with respective ones of two angles of opposite signs. Thus, at any point, said two directions form respectively a positive angle and a negative angle with the perpendicular to said plane at said point. The depth of implantation as measured in the implantation direction, and the inclination of said direction are chosen in such a manner that all of the crystalline semiconductor material that is situated above a certain thickness of the substrate is implanted and made amorphous, and in such a manner that the crystalline semiconductor material situated above said thickness is not implanted or is not sufficiently implanted to be made amorphous. This thickness is measured along the perpendicular to the plane of the substrate. Advantageously, this thickness lies in the range one third of to once the maximum amplitude of the relief of the surface roughness of the semiconductor material;

the implantation is performed over the entire surface of the semiconductor material;

prior to the implantation, the method further comprises depositing a mask that blocks the implantation at least in part;

the mask covers at least a portion of the semiconductor material. It masks a fraction of the semiconductor material relative to the implantation. It can thus be said that the relief of the mask forms shadows that vary as a function of the direction of implantation. Preferably, the zones masked by the mask do not receive any implantation. This method is advantageously but not limitingly used for forming optical gratings, e.g. optical gratings for photonics, and preferably for silicon photonics. Typically, the mask is made of: silicon nitride, or silicon oxide, or hafnium oxide, or more generally, any material having etching selectivity relative to silicon and deposited, for example, by full-wafer chemical vapor deposition, and then patterned by lithography and then chemical or plasma etching, and optionally removed after forming the patterns in the silicon;

the crystalline semiconductor material forms a layer extending mainly in a plane, and the ion implantation is performed in at least two directions that are inclined relative to the perpendicular to said plane.

In an implementation, the ion implantation is performed in two directions respectively inclined at an angle +α and −α relative to the perpendicular to said plane, where 90°>α>0° and preferably 70°>α>20°. In an implementation, the direction and the depth of the implantations are defined in such a manner that the implanted volumes meet under at least one relief carried by the mask, thereby forming a cavity under said relief. Thus, the invention makes it possible to form a cavity under a relief of the mask, and thus to release a portion of crystalline semiconductor material that is situated under the relief and that is protected from the implantations by said relief. In particularly advantageous but non-limiting manner, the invention thus makes it possible to form nanowires. This method is advantageously but not limitingly used for forming nanowires made of semiconductor material. The invention also provides a method of forming nanowires that comprises a method having any one of the preceding characteristics and steps.

In another implementation, prior to the implantation, the following are performed:

forming a stack comprising, in succession, a base substrate forming the crystalline semiconductor to be etched, an insulating layer, a semiconductive surface layer, an insulating layer, and a protective layer that resists the chemical etching based on hydrogen chloride;

etching a trench through the insulating layer, through the semiconductive surface layer, through the insulating layer, and through the protective layer;

forming spacers covering the sides of the trench; the spacers being resistant to the chemical etching based on hydrogen chloride and extending to the surface of the substrate; and etching a cavity in the base substrate opposite the trench. The implantation is performed in the base substrate in at least two directions that are inclined relative to the perpendicular to the plane of the base substrate in such a manner as to amorphize the sides of the cavity etched in the base substrate. Said chemical etching based on hydrogen chloride is performed in such a manner as to widen the cavity in the substrate while also maintaining the width of the trench above the substrate. For example, the cavity and the trench may then be filled with oxide. In particularly advantageous manner, this implementation makes it possible to form isolation trenches having a bottle shape, the body of the bottle shape being formed in the substrate and the neck of the bottle shape being formed by the upper layers.

in an advantageous but non-limiting implementation, the semiconductor material forms a surface layer of a stack of layers of the semiconductor on insulator (SOI) type;

in another implementation, the semiconductor material forms a bulk substrate;

prior to the implantation, the method further comprises depositing a mask that blocks the implantation at least in part, and the semiconductor material forms an optical grating at least in part;

the mask is shaped to allow the implantation to pass through to the level of a zone serving to form a gate for a transistor of the Field-Effect Transistor (FET) type, and the depth of the implantation is defined in such a manner that the portion of semiconductor material situated under the implanted zone defines a channel for the transistor;

the mask is shaped to block the implantation on either side of said zone serving to form a gate for the transistor. The invention thus makes it possible to form a cavity for receiving a gate, while also preserving the thicknesses of the layer of semiconductor material on either side of the gate. These thicknesses are advantageously used to form source and drain zones for the transistor. Thus, the invention does not need any epitaxial growth step for growing the source and drain zones. In particularly advantageous manner, the source and drain zones are self-aligned on the gate. Advantageously, the source and drain zones have thickness homogeneity equal to that of the layer of semiconductor material prior to etching of the cavity serving to receive the gate. The thicknesses of the source zones are therefore controlled accurately, both locally and at the scale of the wafer, thereby improving the performance of the device incorporating the transistors. This method is advantageously but non-limitingly used for forming FETs, e.g. of the Fully Depleted Silicon On Insulator (FDSOI) type. The invention also provides a method of forming FETs that comprises a method having any one of the preceding characteristics and steps.

Prior to the implantation, the method further comprises non-conformal deposition of an absorption layer. In addition, the implantation is performed over a depth of the semiconductor material lying in the range L1 to L2, where L1 is the distance between the free surface of the absorption layer and the highest peak of the reliefs of the surface roughness of the layer of semiconductor material, and where L2 is the distance between the free surface of the absorption layer and the deepest valley of the reliefs of the surface roughness of the layer of semiconductor material. This absorption layer may have stopping power for stopping the implanted species. The stopping power may be of the same order of magnitude as the stopping power of the material to be etched, or it may be greater than said stopping power of the material to be etched.

in an implementation, the etching is etching with hydrogen chloride and preferably with hydrogen chloride in gas phase. In another implementation, the etching is etching with hydrogen chloride and preferably with hydrogen chloride in liquid phase;

the chemical etching is performed at a temperature selected to reduce the recrystallization kinetics, or indeed to prevent recrystallization of the volume that is made amorphous;

the semiconductor material is homogeneous;

the semiconductor material is based on silicon;

the semiconductor material is based on monocrystalline silicon;

the semiconductor material is chosen from among: silicon, silicon-germanium (SiGe), silicon-phosphorus (SiP), silicon-carbon (SiC), and germanium (Ge).

All of the above-mentioned implementations also apply to non-semiconductor materials in each of which the amorphous phase has good etching selectivity relative to its crystalline phase. Typically, "good selectivity" is constituted by selectivity that offers an etching kinetics ratio greater than or equal to 2 and preferably greater than or equal to 10, or indeed ideally greater than or equal to 100.

In the non-limiting examples described below, the etching of a homogenous silicon-based substrate is performed by locally modifying the crystallographic structure of the material by amorphization, and by taking advantage of the difference in etching kinetics between the material in its crystalline state and the material in its amorphous state. This etching method makes it possible to improve the accuracy and the homogeneity of the etching while also offering a large amount of freedom in the geometrical shape of the zones to be etched.

Various implementations of the present invention are presented below.

FIG. 1 summarizes the main steps of an implementation of the invention. These steps are applicable for various advantageous uses of the invention, such as the uses shown in FIGS. 2a to 2d and in FIGS. 3a to 3d.

Step 201 comprises depositing a mask on a top face of a crystalline semiconductor material, typically a layer based on silicon. In this non-limiting example, it is silicon.

Step 220 comprises local amorphizing of the silicon. This local amorphization is obtained by spraying ions onto the face of the silicon layer. The mask blocks a fraction of the ions and another fraction of the ions is implanted in the silicon layer where the mask does not form any protection. The surface of the silicon layer thus has zones that are made amorphous by the implantation and zones that remain in the crystalline state.

In general manner for silicon, depending on the dose of ions and the species of implanted ions, it is possible, beyond a threshold of faults generated by the implantation, to amorphize the silicon. The fault threshold is generally close to 10% of the displaced atoms.

Step 230 corresponds to selectively etching the amorphous zones relative to the crystalline zones. The etching is chosen in such a manner that the etching kinetics of the material in its amorphous state are clearly different from the etching kinetics of the material in its crystalline state. Typically, the speed of etching of the material in its amorphous state is at least twice (or 10 times, or indeed 100 times) greater than the speed of etching of the material in its crystalline state.

An optional step 240 consists in removing the mask used to block the implantation in part. It should be noted that the mask may allow a fraction of the implantation to pass through it. What is important is that the zones that are masked at least in part by the mask remain in their crystalline state.

The steps of FIG. 1 are specified more clearly in the following description of the use shown in FIGS. 2a to 2d.

FIGS. 2a to 2d show the steps for forming a plurality of patterns that, in advantageous but non-limiting manner, form an optical grating.

Figure 2A:
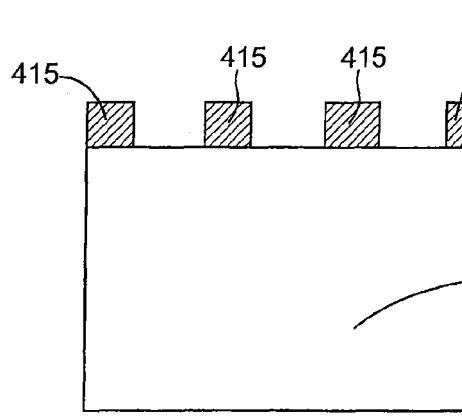
FIGS. 2a to 2d show an implementation of an etching method that, for example, may be implemented for forming optical gratings.

FIG. 2a shows the optical grating structure in the process of being formed, after step 210 of FIG. 1. The layer of silicon-based material is covered with a mask 415 having reliefs that are suitable for blocking the implantation at least in part.

The mask 415 may be monolithic. It may also be made up of a plurality of filter layers. The distance between the reliefs of the mask may be identical or may vary over the surface of the mask.

Figure 2C:
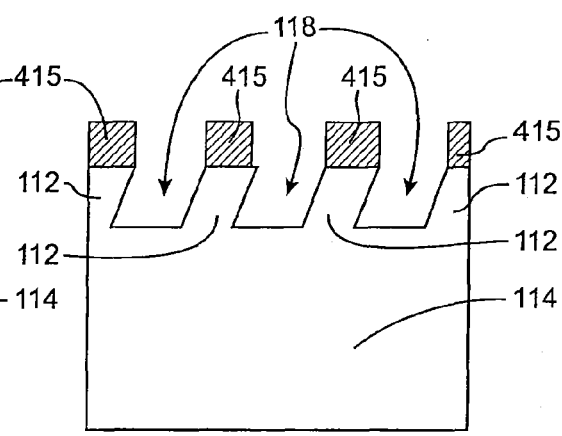
Figure 2B:
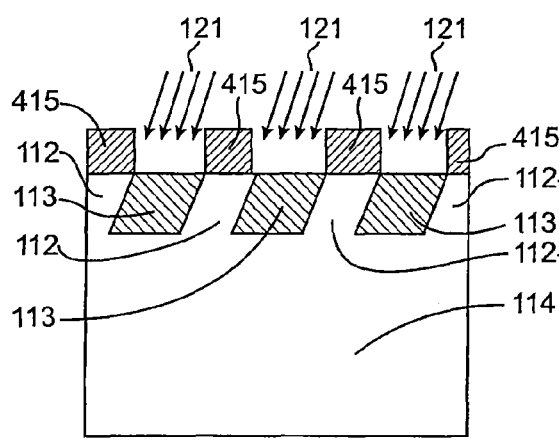

FIG. 2b shows the optical grating structure in the process of being formed after step 220 of FIG. 1. Step 220 consists in implanting a plurality of ions 121 into a substrate 114 so as to amorphize the crystallographic structure of volumes 113, also referred to as "portions" 113, of the substrate 114. The geometrical shapes of the portions 113 that are made amorphous depend, in particular, on: the inclination or tilt of the implantation relative to a plane in which the substrate 114 mainly extends, the depth of the implantation (i.e. the energy (in keV) under which the ions are accelerated, the dose (i.e. the number of ions per unit area) of the implantation, and the geometrical shapes of the reliefs of the mask. In this example, the implantation is performed in a direction that is inclined relative to the perpendicular to the plane of the substrate 114. The implanted portions 113 form parallelepipeds that are inclined at the inclination or tilt of the implantation.

The implanted ions 121 make the semiconductor material amorphous at the portions 113. The portions 112 of the substrate 114 do not receive any or receive only very few ions 121 because the reliefs of the mask 415 protect them from the implantation. These protected portions thus keep their crystalline state. Typically, the substrate 114 thus has a succession of amorphous lines disposed between crystalline lines.

In general, the boundary between the amorphous Si and the monocrystalline Si is very steep, e.g. about 1 nm, because it corresponds to a threshold of displaced atoms, which itself decreases exponentially with increasing depth relative to the top face of the semiconductor material.

FIG. 2c shows the optical grating structure in the process of being formed, after step 230 of FIG. 1. Step 230 consists in performing selective etching so that the material made amorphous is removed selectively from the crystalline material. Advantageously, this etching is etching with hydrogen chloride (HCl) in gas phase. Thus, this etching makes it possible to remove the portions 113 and to leave the portions 112 in place. In the example shown, the shapes of the cavities 118 obtained by etching thus correspond to the shapes of the implanted portions; they thus have inclined parallelepiped shapes.

It should be noted that, in the present implementation, the implanted species of ions 121 is Argon and the HCl etching is thus performed in gas phase. As indicated above, the HCl etching may be performed in liquid phase. For example, another species of ions may then be used, such as, for example, Germanium.

During the gas-phase HCl etching, the portions 113 of amorphous Si are fully removed, whereas very little monocrystalline Si of the portions 112 is etched, because the speed of etching of amorphous Si is about 100 times greater than the speed of etching of monocrystalline Si.

In addition, in order to avoid recrystallization, the HCl etching should be performed at a temperature that is sufficiently low, e.g. lower than 600° C., for the recrystallization kinetics to be lower than the etching kinetics. In order to avoid this problem, it is possible to implant another species, such as germanium (Ge) or carbon (C), which, in addition to the amorphization, creates a silicon-germanium alloy (SiGe) and a silicon-carbon alloy (SiC) respectively. In which case, even if the recrystallization kinetics of the alloy are faster than the etching kinetics, the material formed after recrystallization is a crystalline material different from silicon (SiGe or SiC), and having etching kinetics that are very remote from, and typically faster than, the etching kinetics of crystalline silicon.

Figure 2D:
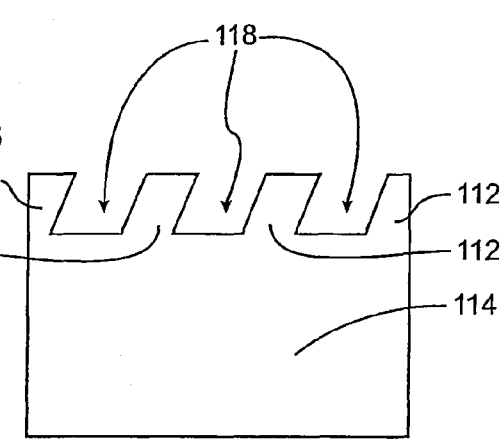

FIG. 2d shows the optical grating structure in the process of being formed, after step 240. Step 240 consists in removing the mask 415. In this way, a grating is obtained that has cavities 118 having dimensions that are controlled accurately. In addition, the shape of the cavities can be inclined without any difficulty. Furthermore, the starting substrate 114 can be homogeneous and does not need to have an etch stop layer.

In silicon photonics, forming optimized optical gratings sometimes requires the pitch of the grating to be adjusted to within one nanometer, or indeed to cause the pitch to vary within the same grating. In practice, this is difficult to obtain with conventional etching methods because of the above-described loading effects or capillary action effects. Such effects tend to cause the etching depth to vary as a function of the size of the patterns to be etched and thus of the size of the openings in the mask. The present invention makes it possible to overcome such loading effects or capillary action effects, because the local ion implantation does not depend on the environment, such as the dimensions of the mask 415, etc. In the method described in the invention, in order to cause the depth of the grating to vary, it is possible to mask different parts of the wafer sequentially, e.g. with a resin mask, and to perform amorphizations by ion implantations that have different characteristics, such as different energies.

FIGS. 3a to 3d show another particularly advantageous use of the present invention. The steps shown in these figures make it possible, in particular, to form a nanowire. These steps follow the steps 210 to 240 shown in FIG. 1 and mentioned above.

The purpose of this implementation is to release a portion 117 of its original substrate 114, the portion 117 serving to form a nanowire made of the crystalline material forming the substrate 114. For this purpose, a cavity 118 is formed around the portion 117 in the crystalline substrate 114. To this end, the direction of the implantation, i.e. the angle or the degree of the implantation, is adjusted so as to form a cavity 118 making it possible to release the portion 117. More precisely, the ions are implanted in two inclined directions. Preferably, these two directions form an identical angle on either side of the perpendicular to the bottom face of the substrate 114. For example, each implantation direction forms an angle $A_1$ lying in the range 20° to 70° relative to said perpendicular. The angle $A_1$ is chosen in such a manner as to form a portion 117 having its section defined by a first side formed by the top face of the layer of semiconductor material, and two other sides extending from the first side and together forming an angle equal to twice the angle $A_1$.

Figure 3A:
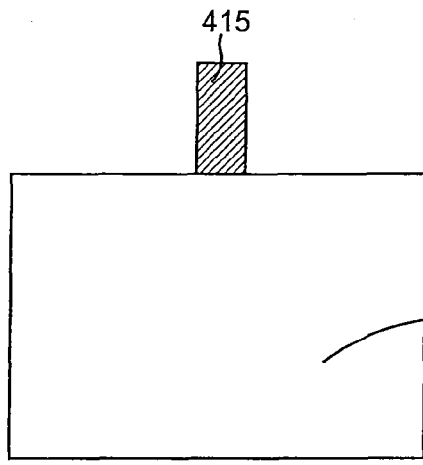
FIGS. 3a to 3d show an implementation of an etching method that, for example, may be implemented for forming nanowires.
Figure 3B:
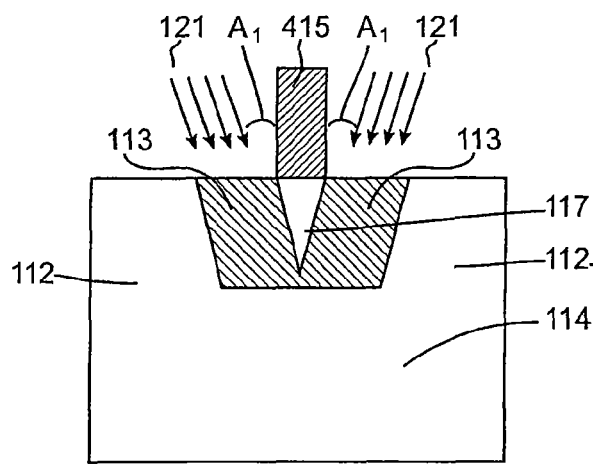
Figure 3C:
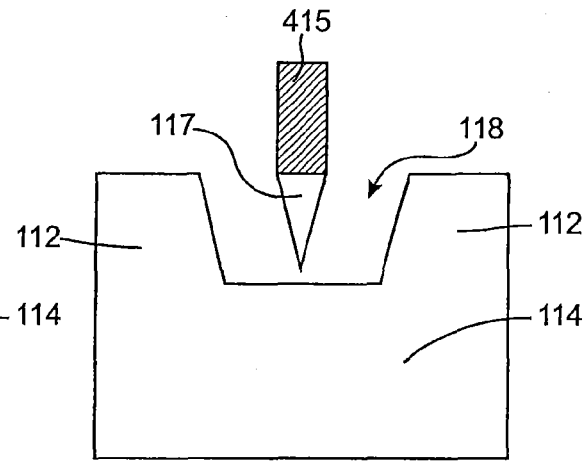

In other words, the portion 117 is defined by two portions 113 that are made amorphous, each having a parallelepiped shape inclined respectively at an angle $A_1$ and at an angle $-A_1$, so as to meet, as shown in FIG. 3b.

Figure 3D:
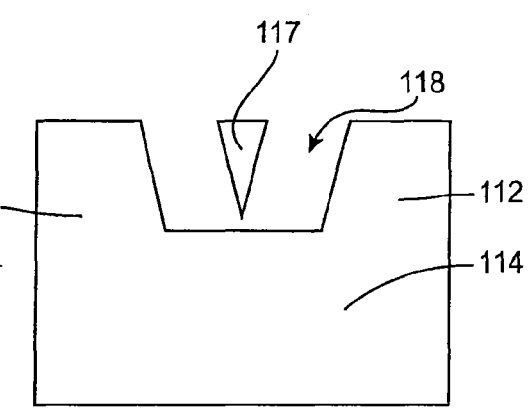

Then, in step 230, gas phase HCl etching is performed to remove the portion 113 of amorphous Si. The cavity 118 is then obtained. It is in the shape of two inclined parallelepipeds facing each other and meeting under the portion 117. The portion 117 is thus released and forms a nanowire, as shown in FIG. 3d.

Figure 4A:
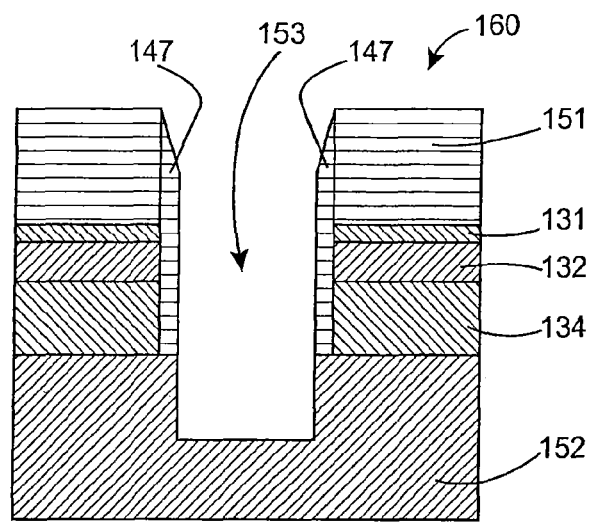
FIGS. 4a to 4c show an implementation of an etching method for forming an isolation trench, e.g. a Shallow Trench Isolation (STI) trench having an asymmetric bottling shape.
Figure 4B:
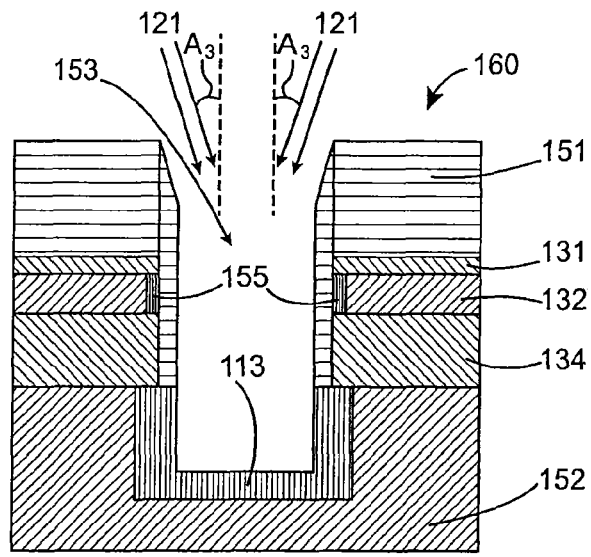
Figure 4C:
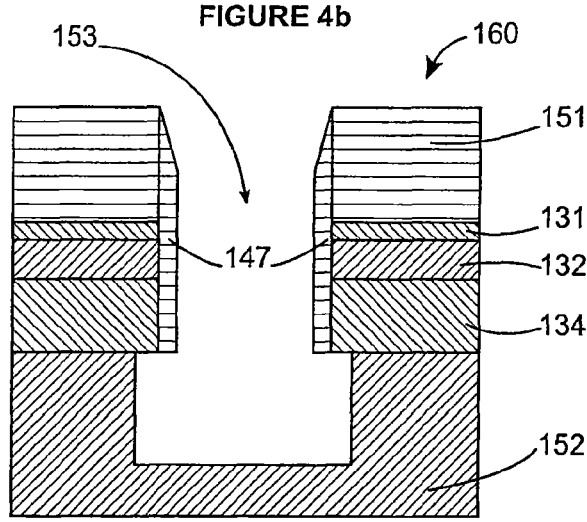

FIGS. 4a to 4c show another particularly advantageous use of the present invention. The steps shown in the figures make it possible, in particular, to form an isolation trench of the Shallow Trench Isolation (STI) type, the shape of which is of the "bottling" type, i.e. it has a bottle shape or has a neck close to the surface or has a narrow mouth. More precisely, the purpose of this implementation is to form an isolation trench 153 having an asymmetric bottling shape. The asymmetry of this shape means that, in a plane (section plane shown in FIGS. 4a to 4c), the STI trench has to have volume that increases while its depth is increasing, whereas in another plane (perpendicular to the section plane of FIGS. 4a to 4c), it should not have any increase in its volume while its depth is increasing. The isolation trench 153 is also referred to below as the "STI trench 153".

FIG. 4a shows a standard stack 160 before the STI trenches are formed and after spacers 147 have been deposited, and after at least one etching step has been performed. Starting from the base, the stack 160 comprises: a layer 152 forming a base substrate, e.g. of silicon; an insulating layer 134 that is typically a buried oxide (BOX) layer; and an active layer or surface layer 132 made of a semiconductor material. This surface layer is preferably crystalline or indeed monocrystalline. Typically, it is a monocrystalline silicon layer. This surface layer 132 serves to form the conduction channel of the transistor.

Typically, the stack of the layers 152, 134 and 132 forms a stack of the semiconductor on insulator (SOI) type when the surface layer 132 is made of silicon.

The stack 160 further comprises a continuous insulating layer, typically a layer of oxide 131, and preferably formed starting from the surface layer 132 and overlying said surface layer. The stack 160 further comprises a nitride layer 151 that is situated on the oxide layer 131. In this implementation, the thicknesses of the layers 151, 131, 132, 134 are respectively 80 nanometers (nm), 10 nm, 7 nm, and 25 nm, without these values being limiting.

Then first etching is performed to form an STI trench 153. The shape of this trench is typically rectangular channel-section, and the width of the trench is therefore constant over its entire depth. This first etching etches the layers 151, 131, 132, and 134 and stops on the face of the substrate 152.

Spacers 147, e.g. of nitride, are then formed in the STI trench 153 and in contact with the sides of the layers 151, 131, 132, and 134, so that the layers 151, 131, 132, 134 are not implanted with ions 121 or etched during the following steps. The thickness of the spacers 147 is, for example, in the range 5 nm to 15 nm. Preferably, the top edge of each spacer 147 is inclined towards the centre and towards the bottom of the trench.

Second etching is then performed in the substrate 152 so as to deepen the STI trench 153. A cavity is thus formed in the substrate 152.

FIG. 4b shows the structure of the stack 160 after step 220 of FIG. 1. In this ion implantation step 220, the direction of implantation, i.e. the angle ("degrees" or "tilt") of the implantation is adjusted to amorphize the crystalline structure of the sides and of the top face of the base substrate 152 that forms the cavity defined during the etching of the substrate. The parts to be etched are referred to below as "portions 113". More precisely, the ions 121 are implanted in two inclined directions.

Preferably, these two directions form an identical angle on either side of the perpendicular to the bottom face of the substrate 160. For example, each implantation direction forms an angle $A_3$ of about 15° relative to said perpendicular. The angle $A_3$ of 15 degrees is a typical example because the critical angle is given by the ratio of the depth of the STI trench 153 (e.g. 200 nm) to its typical width (e.g. 50 nm).

The inclination of the top edges of the spacers 147 makes it possible to widen the opening of the trench and thus to incline the implantation direction to a greater extent.

It should be noted that, during the ion implantation, the sides of the surface layer 132 can be partially amorphized. This is illustrated by the portions 155 in FIG. 4b. The presence of the spacers 147 makes it possible to limit the amorphization of the portions 155. More importantly, this presence of the spacers 147 makes it possible not to expose the portions 155 to the etching solution. These portions 155 that might be amorphized thus remain in place after the etching. Advantageously, provision is made for annealing then to be performed so as to recrystallize these portions 155 that have unintentionally been made amorphous. For example, the annealing temperature is about 1050° C., for 30 minutes.

FIG. 4c shows the structure of the stack 160 after step 230 of FIG. 1. In this step 230, etching with HCl, preferably in gas phase, is performed to remove the portion 113 of the substrate 152 that has been made amorphous. The cavity of the substrate 152 is widened and the shape of the STI trench 153 is then defined. The portions 155 of the surface layer 132 that have unintentionally been made amorphous are protected by the spacers 147. Thus, they are not exposed to the HCl etching and are therefore not removed during the HCl etching.

Thus, a cavity is obtained that, in a direction parallel to the plane of the substrate 152, has width greater than its width in the layers 134, 132, 131, 151 that overlie it. This cavity is in the shape of a bottle whose body is formed by the substrate 152 and whose neck is formed in the layers 134, 132, 31, 151. The neck is defined by the initial shape of the trench prior to amorphization.

Preferably, the implantation directions are inclined only in the section plane of FIGS. 4a to 4c. The direction of implantation is not inclined in a plane perpendicular to the section plane of FIGS. 4a to 4c. The bottle shape of the trenches is thus asymmetrical.

In order to finish forming the STI trenches 153, the cavity is filled by depositing oxide in it, and, for example, Chemical Mechanical Polishing (CMP) is performed.

The invention thus makes it simple to obtain a shape that is otherwise complex to form.

Figure 5A:
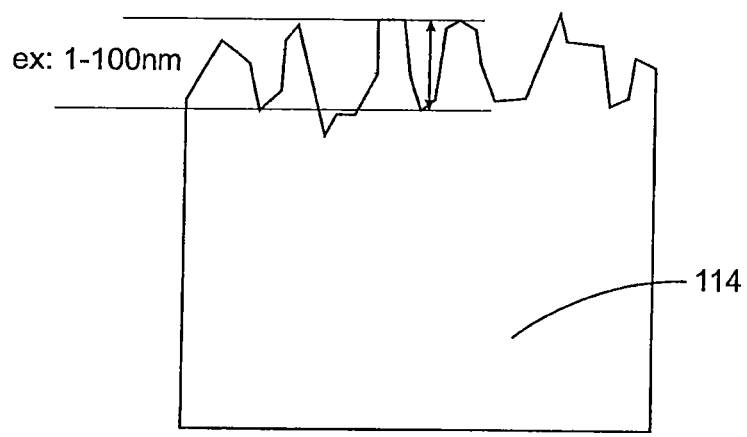
FIGS. 5a to 5c show an implementation of an etching method that, for example, may be implemented for reducing the roughness of a surface.
Figure 5B:
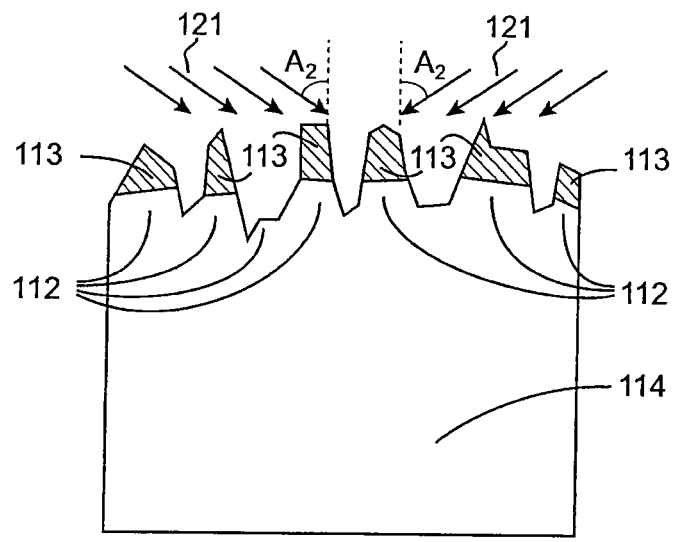
Figure 5C:
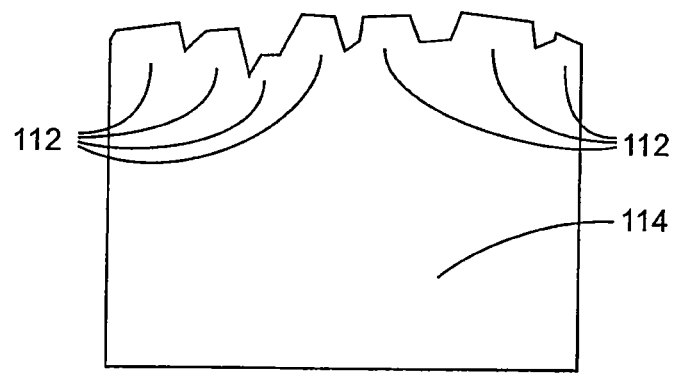

FIGS. 5a to 5c show another particularly advantageous use of the present invention. The steps shown in these figures make it possible, in particular, to even out a surface or to reduce its roughness simply and effectively.

FIG. 5a is a section view of a substrate 114 having a top surface that is very rough. The substrate 114 is made of a crystalline material, e.g. of monocrystalline silicon. The surface roughness of the crystalline material is not good, and the distance between the "peaks" and the "valleys" of the protuberant parts of said surface varies in the range 1 nm to 100 nm. That distance is often referred to as "peak-to-valley" distance.

FIG. 5b shows a section view of the substrate 114 after the ion implantation step 220. At this stage, a plurality of ions 121 are implanted in inclined manner in order to amorphize the portions 113 that form the protuberant portions. Thus, only the projecting portions 113 are implanted, while the non-projecting portions are masked by the projecting portions 113 and are not implanted.

Preferably, the inclination forms an angle $A_2$ with the perpendicular to the plane of the substrate 114 that lies in the range 70° to 89°. In general, the greater the inclination or tilt, the smaller the thickness of implanted substrate.

In particularly advantageous manner, the implantation is performed in two opposite inclinations relative to the perpendicular to the plane of the substrate 114.

Thus, at any point, these two inclined directions form respectively a positive angle and a negative angle with the perpendicular to the plane at said point.

The angles formed by each of the directions may be equal, as shown in FIG. 5b in which one direction forms an angle $+A_2$ and the other direction forms an angle $-A_2$ with the perpendicular to the plane of the substrate. In another implementation, it is possible to make provision for the amplitudes of each of the angles to be different.

The implantation is performed over a depth of the semiconductor material lying in the range one-third of to once the maximum amplitude of the relief of the surface roughness of the semiconductor material.

The inclination is chosen in such a manner that all of the crystalline semiconductor material 114 situated above said depth is implanted with a dose sufficient to make the semiconductor material amorphous. The inclination is chosen in such a manner that the crystalline semiconductor material 114 is not implanted below said depth or is implanted with a dose insufficient for making the semiconductor material amorphous. The upper portions of the projecting reliefs mask the lower portions of the other reliefs and the lower portions of the troughs or "valleys". Thus, the inclination prevents the ions from implanting in the bottoms of the valleys and at the bases of the projecting reliefs.

Therefore, only the top portions of the projecting reliefs are implanted and made amorphous.

Preferably, no mask is deposited above the substrate 114.

Preferably, the implantation is performed over the entire wafer.

FIG. 5c shows a section view of the substrate 114 after the HCl etching step 230. The HCl etching has good selectivity in gas phase in removing the amorphous Si of the portions 113 relative to the monocrystalline Si not made amorphous 112 of the substrate 114. Only the upper portions of the projecting reliefs are removed during the etching. The top surface is the substrate 114 is thus made less rough. Its surface roughness is improved.

Thus, the selective etching method makes it possible to reduce the roughness of the surface of the semiconductor material.

It should be noted that steps 210 and 240 of the method of FIG. 1 are optional in this implementation. In the implementation shown in FIGS. 5a to 5c, the ion implantation may be performed without using a layer forming a mask 415.

FIGS. 6a to 6e show another particularly advantageous use of the present invention. The steps shown in these figures also make it possible to even out a surface or to reduce its roughness simply and effectively.

Figure 6A:
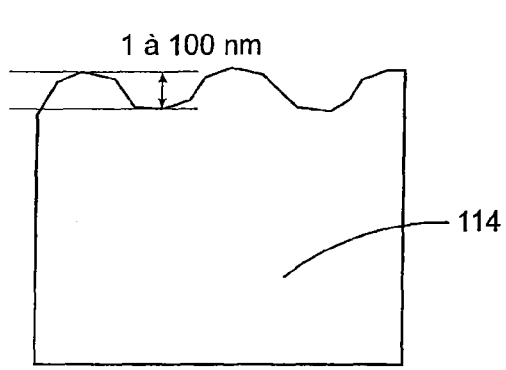
FIGS. 6a to 6e show another implementation of an etching method that, for example, may be implemented for evening out a surface.
Figure 6B:
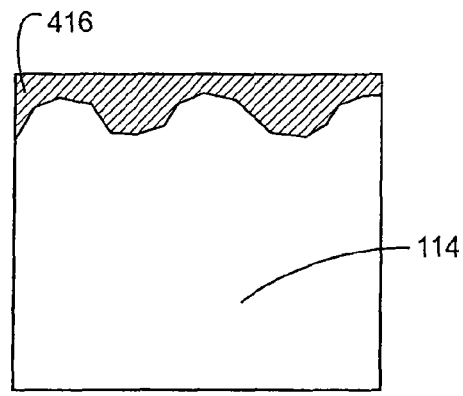

FIG. 6a is a section view of a substrate 114 having a top surface that is rough or that has unevenness. The substrate 114 is made of a crystalline material, e.g. of monocrystalline silicon. The protuberant portions at the surface of the substrate 114 are more undulating than the substrate 114 of the implementation shown in FIGS. 5a to 5c. The peak-to-valley distance of the protuberant portions varies in the range 1 nm to 100 nm.

Figure 6C:
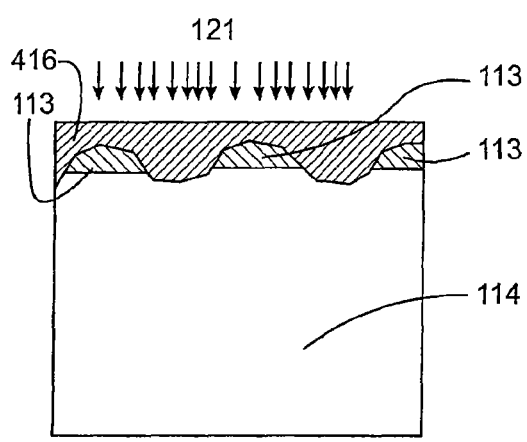

FIG. 6c shows a section view of the substrate 114 after step 210. Non-conformal deposition of an absorption layer 416 is performed. Typically, this deposition is performed by spin coating. The deposition is performed in such manner as to cover the entire top surface of the substrate 114. Advantageously, the material of the absorption layer 416 is of the silicon nitride or silicon oxide type, or of the Silicon-On-Glass (SOG) type. The top face of the absorption layer 416 is substantially parallel to the bottom face of the substrate 114.

FIG. 6c shows a section view of the substrate 114 after step 220. At this stage, ion implantation is performed in a direction that is perpendicular relative to the plane formed by the top face of the absorption layer 416 and preferably in such a manner as to amorphize only the protuberant portions, i.e. the portions 113. This absorption layer 416 may have stopping power for stopping the implanted species. The stopping power may be of the same order of magnitude as the stopping power of the material to be etched, or it may be greater than said stopping power of the material to be etched. The implanted depth, i.e. the distance, measured in a direction perpendicular to the plane of the substrate, between the free surface of the absorption layer 416 and the deepest ions implanted in the substrate to be etched at a dose sufficient to cause amorphization of the substrate to be etched, is:

greater than the distance between the surface of the absorption layer and the peaks of the highest reliefs of the substrate to be etched;

less than the distance between the absorption layer and the lowest valley of the substrate to be etched.

The depth to which the ions are implanted in the absorption layer 416 is either equal to said depth if the stopping power of said absorption layer 416 is equal to the stopping power of the substrate to be etched, or else it is less than said depth if the stopping power of said absorption layer 416 is greater than said stopping power of the substrate to be etched. In this situation too, the ions are not implanted in sufficient quantities in a low valley of the substrate to be etched.

Thus, only the portions of semiconductor material that are situated at a depth less than a predefined depth are made amorphous. In other words, only the peaks extending above a predefined height relative to a bottom face of the substrate are made amorphous.

Figure 6D:
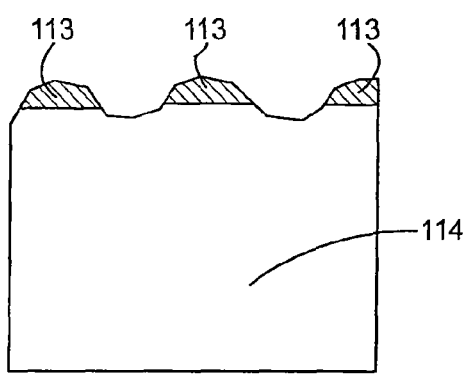

In FIG. 6d, the absorption layer 416 is removed, e.g. chemically. The portions 113 that are made amorphous are left in place at this stage.

Figure 6E:
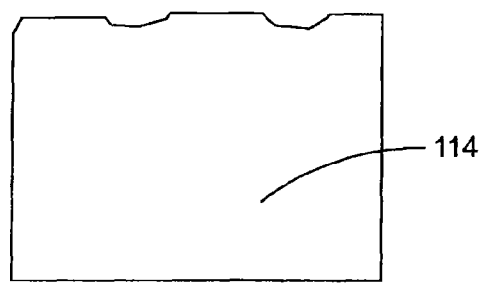

FIG. 6e shows a section view of the substrate 114 after step 230. The good selectivity of the gas phase HCl etching makes it possible to remove the amorphous Si of the portions 113 and to leave in place the monocrystalline Si of the portions 112 of the substrate 114 that are not made amorphous. The peaks of the surface of the substrate to be etched are thus removed. The top surface of the substrate 114 is thus evened out.

It is possible to perform the implantation over a thickness less than the thicknesses of the protuberances. In which case, the bases of the protuberance are kept while also improving the surface roughness. In a variant implementation, the implantation is performed over a thickness greater than the thicknesses of the protuberances. In which case, the protuberances are removed over their entire heights. The roughness of the surface is the roughness defined by the HCl etching.

In this implementation, the top face of the substrate 114 may have slight unevenness without having undulations. This implementation makes it possible to reduce skew of the top face of the substrate 114.

FIGS. 7a to 7g show an implementation for forming a transistor of the MOSFET type in which the source and drain zones are not formed by epitaxial growth. This implementation is particularly advantageous for forming transistors of the FDSOI type. Usually, the source and drain zones are formed by epitaxial growth of the surface layer of a stack of the SOI type. This surface layer serves to form the conduction channel of the transistor. Due to the successive etching steps for making the surface layer thinner and for achieving a thin channel, the surface layer can lack material at certain places. The epitaxial growth of the source and drain (S/D) zones is then affected. This results in large variations in the thickness of the S/D zones or indeed of regions in which the silicon cannot grow. Such undesired variations are to be found both locally, i.e. at each transistor, and at the level of the entire wafer. Such variations degrade the performance of the transistors and the efficiency of the circuits.

In the implementation shown in FIGS. 7a to 7g, it is proposed to keep the initial thickness of the surface layer, i.e. the thickness obtained after forming the SOI stack, and then to etch said surface layer so as to form a cavity and to house the gate of the transistor in said cavity. The S/D zones are then defined on either side of the gate by the initial thicknesses of the surface layer. These thicknesses are not affected by successive etching steps as they are with known solutions. In particularly advantageous manner, the cavity in the surface layer for constituting the gate is formed using the method of the present invention: amorphizing the initially crystalline surface layer in register with an opening of a mask, and then selectively etching the semiconductor material relative to the amorphous material. The etched depth is thus defined very accurately, and the height of the conduction channel is thus controlled.

This implementation is described in more detail below with reference to FIGS. 7a to 7g.

Figure 7A:
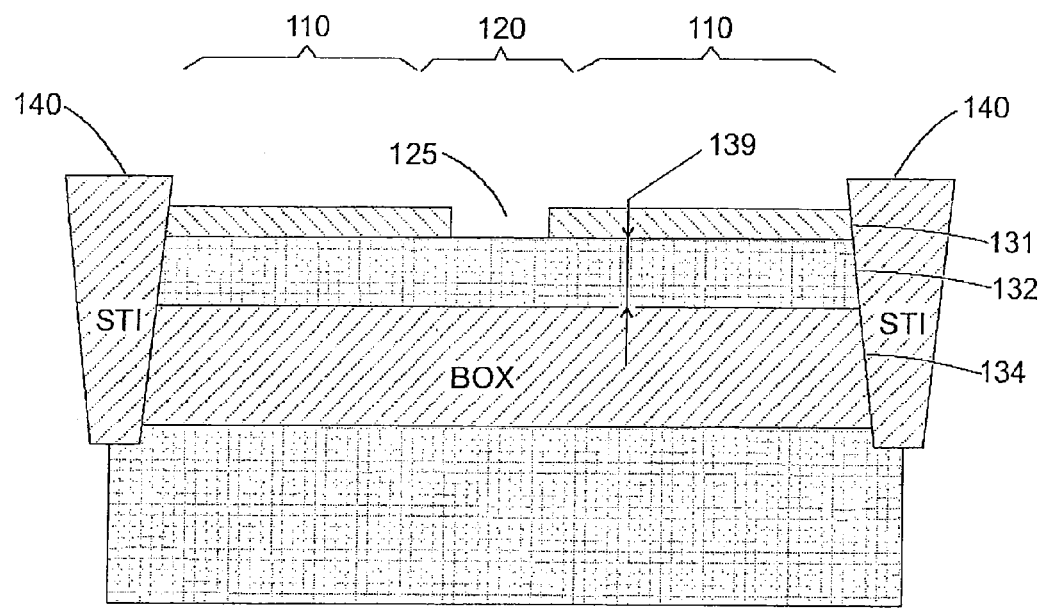
FIGS. 7a to 7g show an implementation for forming a transistor of the Metal-Oxide-Semiconductor Field-Effect Transistor (MOSFET) type in which the source and drain zones are not formed by epitaxial growth and in which the gate is formed in a cavity obtained by etching a layer of semiconductor material.

FIG. 7a shows a stack of layers of the semiconductor on insulator type 132. The surface layer 132 of semiconductor is crystalline. It is silicon, and preferably monocrystalline silicon. The insulating layer is typically a buried oxide (BOX) layer 134. Optionally, isolation wells 140 define each transistor of a wafer. They form isolation trenches 140 or STI trenches around each of the transistors. In addition, a continuous insulating layer, typically a layer of oxide 131, and preferably formed starting from the surface layer 132 overlies said surface layer. The layer of oxide 131 has an opening opposite which a cavity is subsequently formed.

As indicated above, advantageously a step for making the surface layer 132 of the SOI substrate thinner is not performed, and said substrate keeps its original thickness 139 that is typically 12 nm and that can advantageously be chosen to lie in the range 12 nm to 15 nm when the method of the invention is implemented. The "original thickness" or "initial thickness" is the thickness 139 of the surface layer 132, as measured in a direction that is substantially perpendicular to the plane in which said layer extends, that it has at the start of the method. Unlike in the prior art method, the layer of oxide 131 formed at the surface of the surface layer 132 is kept when the gate 120 is formed. The thickness 139 of the surface layer 132 is not modified following formation of the layer of oxide 131.

The gate 120 is then defined by means of a conventional photolithography operation. The patterns 125 of the gate are etched in the layer of oxide 131 that has been deposited or that has been grown thermally from the silicon surface layer 132 of the SOI substrate. It should be noted that this lithography operation is the reverse of what is usually performed, where it is the source and drain zones 110 that are opened by photolithography.

Figure 7B:
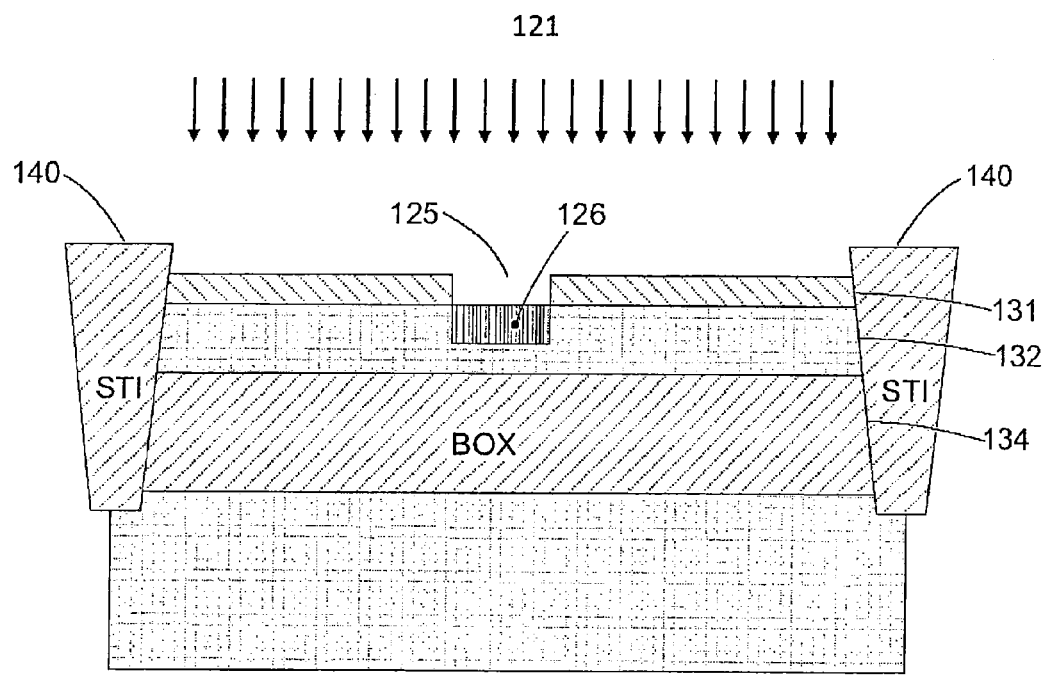

FIG. 7b shows the following step in which, in the opened zones 125, the silicon of the surface layer 132 is amorphized. Advantageously, the amorphization takes place by ion implantation 121 over a controlled depth.

Figure 7C:
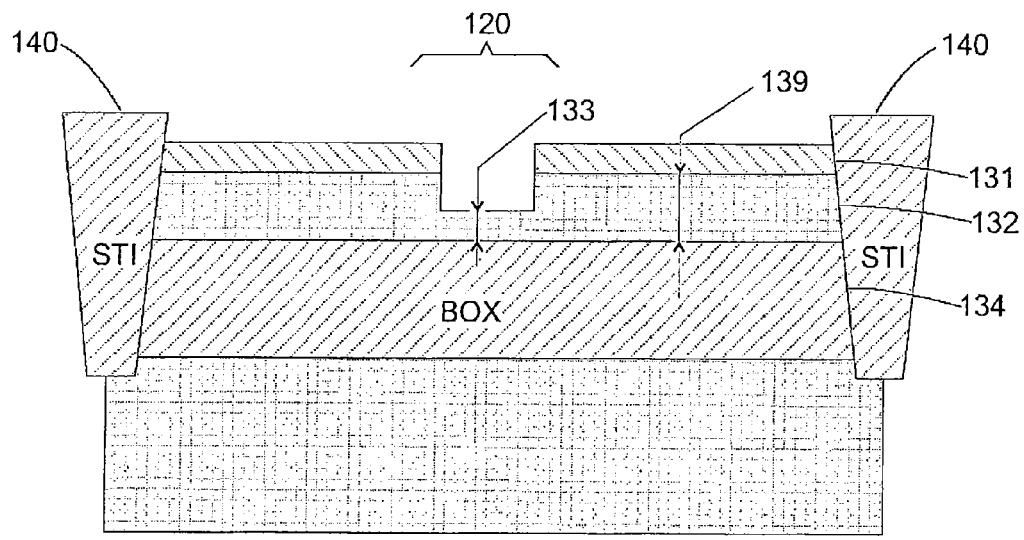

FIG. 7c shows the result of the highly anisotropic etching of the silicon zones made amorphous by the preceding operation. The etching takes place in gas phase in the presence of hydrogen chloride (HCl). The preceding amorphization step and the etching of the amorphous silicon leave a residual thickness 133 of the surface layer 132 of the SOI substrate that defines the desired height for the conduction channel. This selectivity of the etching of the semiconductor material that has been made amorphous relative to the semiconductor that remains crystalline makes it possible to achieve good control over the depth of the etching and thus to achieve good control over the thickness of the channel. Thus, unlike in the standard method, the surface layer 132 is made thinner only where genuinely necessary for adjusting the electrical parameters of the transistor. The surface layer 132 keeps its entire initial thickness 139 outside said zones. The good uniformity of the original layer of the SOI substrate is not degraded by successive etching as it is in the standard method.

Figure 7D:
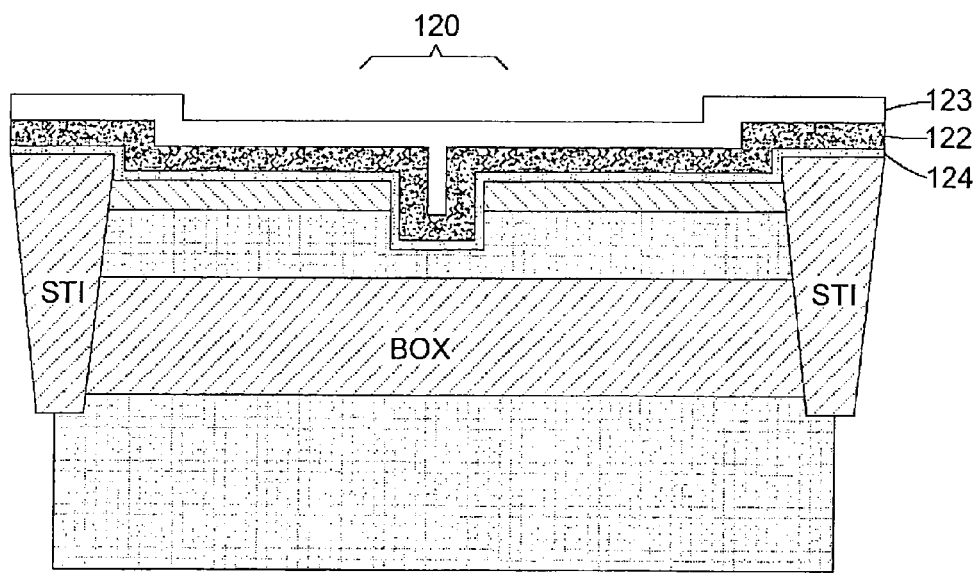

FIG. 7d shows the deposition, over the entire wafer, of a plurality of layers forming the stack of layers of the gate electrode. These layers are known per se. Typically, they comprise a layer of oxide 124, a layer of metal 122, and a layer of polycrystalline silicon 123. Advantageously, it is also possible to form a spacer (not shown) with another material prior to depositing the above stack of gate layers. The material constituting the spacer may be silicon nitride or silicon oxide, e.g. of the "High-Temperature Oxide" ("HTO") type, or indeed tetraethyl orthosilicate (TEOS) having a dielectric constant that is less than the dielectric constant of the material of the oxide layer 124 having high permittivity (high-k), in order to reduce the stray capacitance between firstly the source and drain (SD) electrodes and secondly the gate electrode.

Figure 7E:
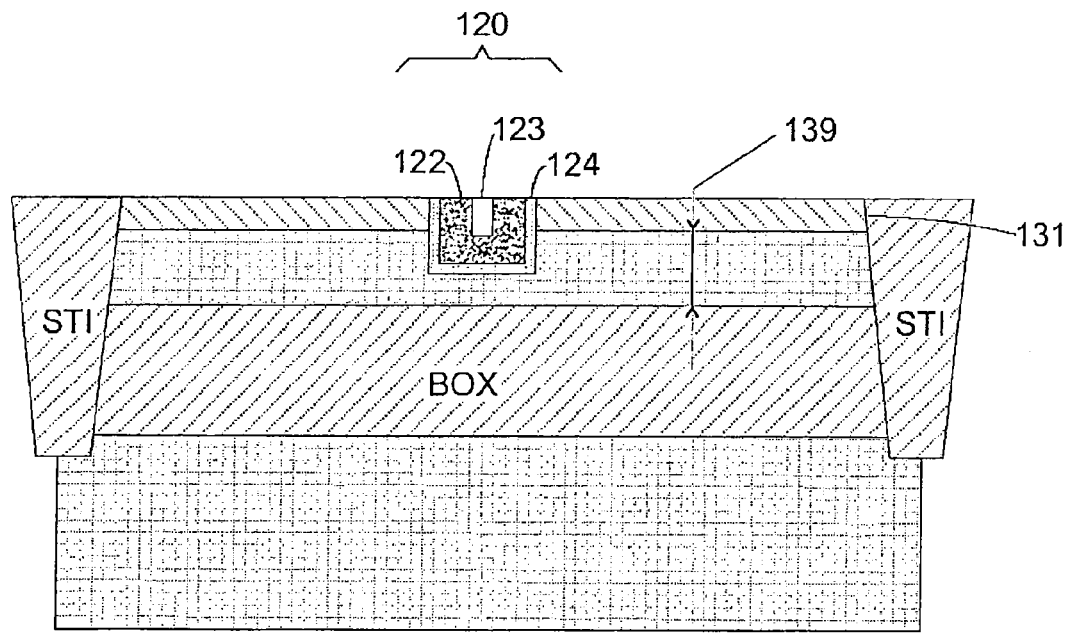

FIG. 7e shows the result of a Chemical Mechanical Polishing (CMP) step 175 that is then performed so as to leave the above layers only in the patterns etched previously and defining the gate 120. The polishing is stopped in the oxide layer 131 covering the surface layer 132 of the SOI substrate. It should be noted once again that the uniformity and the thickness 139 of the layer 134 are the uniformity and thickness of the starting SOI substrate and have not been degraded in any way by the preceding steps of the method of the invention.

Figure 7F:
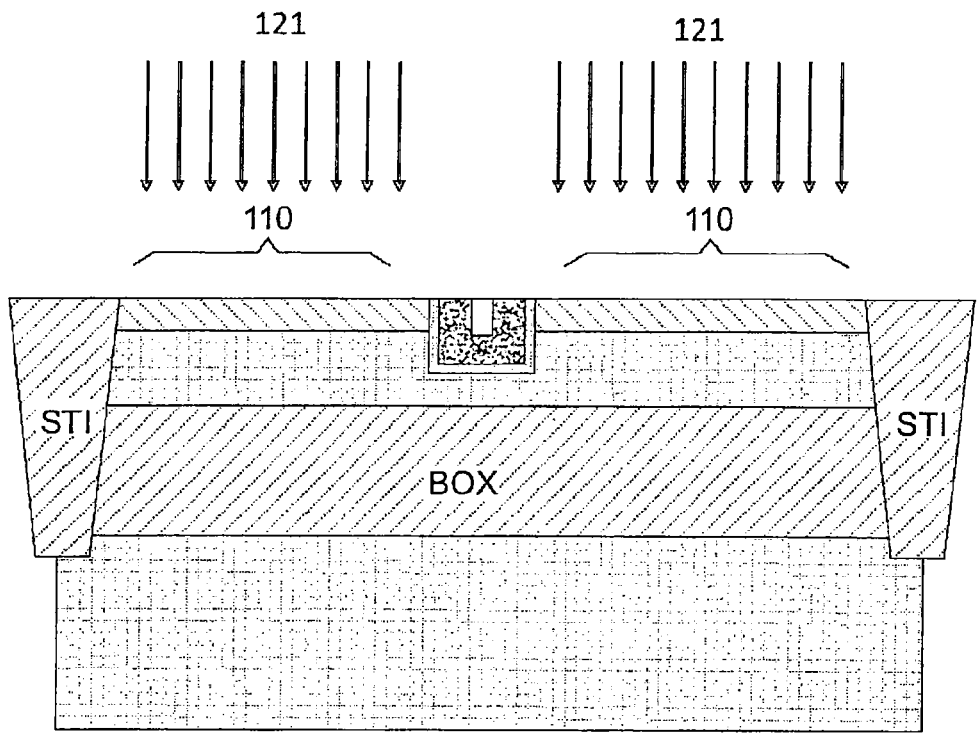

FIG. 7f shows forming the source and drain zones by ion implantation 121 of dopants. It is possible to limit the implantation to the zones serving to form the source and drain only. In another implementation, the layer of oxide 131 is removed prior to the ion implantation step and then implantation is performed over the entire surface of the transistor and preferably over the entire surface of the wafer. The implantation thus takes place without the gate stack being protected. Provision is previously made for the gate stack to have a height greater than the implantation depth. The gate stack thus keeps a non-implanted portion. This second implementation enables the source and the drain to be self-aligned on the gate.

Figure 7G:
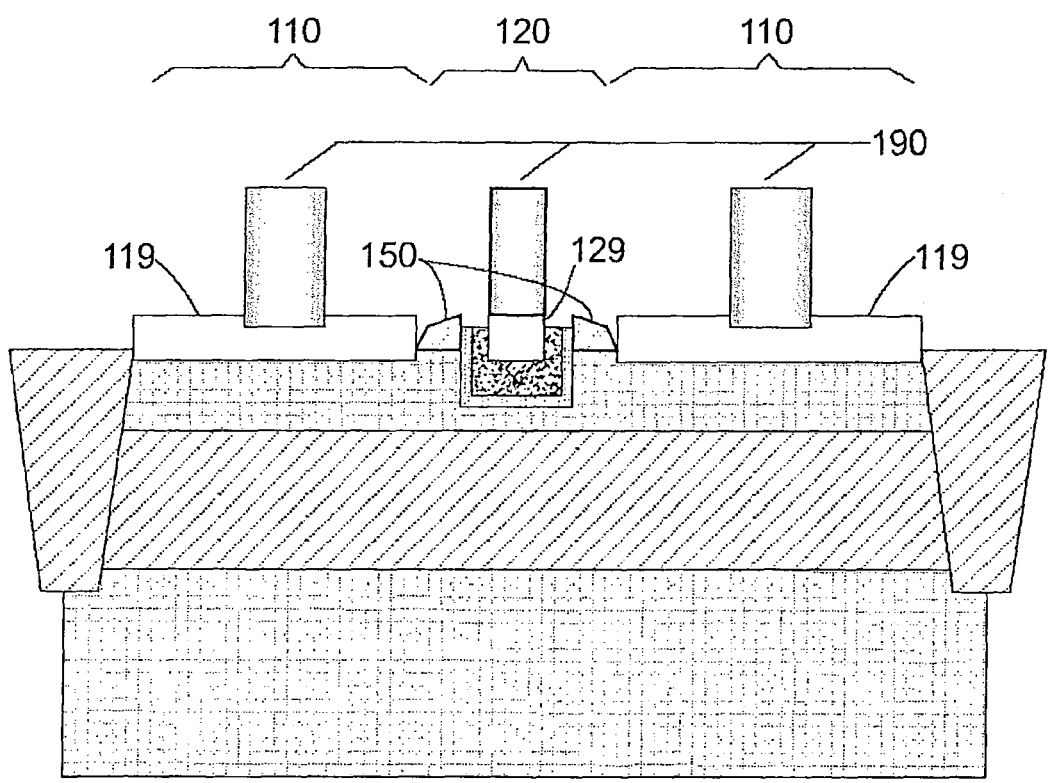

FIG. 7g shows the final structure of the transistors after the layer of oxide 131 has been removed and after the source and drain electrodes 119 and the gate electrode 129 have undergone silicidation. Hydrofluoric acid (HF) etching is performed in order to remove the oxide layer 131. In a variant implementation in which the layer 131 is silicon nitride, it is possible to etch it with a mixture of HF and of ethylene glycol, or indeed with hot orthophosphoric acid. This operation makes it possible to obtain good electrical contact on the electrodes with the metal-plated vias or plated through holes 190 that are formed during standard operations known as Back End of Line (BEOL) operations, during which the interconnections between the active components are formed.

Indications applicable to all of the above-described implementations are given below.

It should be noted that there exists a broad range of species of implantable ions to choose from, e.g. argon (Ar), germanium (Ge), phosphorus (P), and carbon (C), etc. The dose of ions should be sufficiently large to amorphize the material to be etched, which is typically silicon.

For example, in order to etch a thickness of silicon lying in the range 5 nm to 18 nm, a dose of Argon ions is chosen and an implantation energy is chosen as indicated in the table below. In this table, the implantation is performed with an inclination or tilt of 20 degrees relative to the perpendicular to the plane of the layer of silicon, and a/c corresponds to the depth of the amorphous/crystalline boundary related to the fault threshold.

ARGON, 20° of Tilt

| Dose (cm-2) | E (keV) | | |
|---|---|---|---|
| a/c (nm) | 2 | 4 | 8 |
| $5^e14$ | 4.8 | 8.2 | 14.7 |
| $1^e15$ | 5.7 | 10.1 | 18.1 |

Thus, in another example, for amorphizing about ten nanometers of silicon, germanium (Ge) is implanted with a dose of about $1^e16$ ions/cm$^2$, with an implantation energy lying in the range 4 keV to 10 keV.

In order to etch thicknesses of up to 100 nm, higher implantation energies are involved.

In general, the dose/energy pair is adjusted in order to obtain the desired amorphization and thus the desired etching.

The person skilled in the art can use the software CTRIM to determine, by applying the Monte Carlo method, the implantation conditions making it possible to amorphize the desired thickness. Some implantation conditions are indicated below that make it possible to amorphize silicon over a thickness lying in the range approximately 20 nm to more than 100 nm.

Thickness (in nm) of amorphized silicon when the implanted species is Argon (perpendicular to the surface)

| Implantation energy | 10 keV | 30 keV | 60 keV |
|---|---|---|---|
| Dose = $1^e15$ cm-2 | 21 | 56 | 103 |
| Dose = $5^e15$ cm-2 | 27 | 65 | 116 |

Thickness (in nm) of amorphized silicon when the implanted species is Germanium (perpendicular to the surface)

| Implantation energy | 10 keV | 30 keV | 60 keV |
|---|---|---|---|
| Dose = $1^e15$ cm-2 | 19 | 44 | 79 |
| Dose = $5^e15$ cm-2 | 23 | 53 | 93 |

To have good etching selectivity for etching the amorphous silicon relative to the crystalline silicon, it is possible to use gas-phase HCl etching at a temperature less than 600° C., typically 550° C., at a partial pressure preferably lying in the range 100 pascals (Pa) to 100,000 Pa.

The method proposed by the present invention advantageously makes it possible to etch zones of varied shapes. The method thus offers the above-mentioned advantages of ion implantation and of gas-phase HCl etching. Briefly, the advantages of the invention are as follows:

The possibility of defining zones of varied geometrical shapes.

Very good selectivity within a material that is initially homogeneous, e.g. selectivity of about 100 between the crystalline and amorphous states of the material.

Elimination or attenuation of the loading effect or of the capillary action effect. The etching depth is thus made independent of the size of the patterns.

The possibility of obtaining vertical walls even for walls defining patterns of large sizes.

Rapidity of etching.

Homogeneity of etching. The non-uniformity is less than 1% at the level of a wafer having a diameter of 300 millimeters (mm).

Absence of any etch stop layer.

The invention is not limited to the above-described implementations, but rather it extends to any implementation covered by the claims.

The invention claimed is:

1. A method of etching a crystalline semiconductor material, the method comprising:
    non-conformal depositing of an absorption layer on the semiconductor material;
    implanting a plurality of ions in at least one volume of the semiconductor material in such a manner as to make the semiconductor material amorphous in the at least one implanted volume, and as to keep the semiconductor material in a crystalline state outside the at least one implanted volume; and
    selectively etching, with hydrogen chloride, the amorphous semiconductor material relative to the crystalline semiconductor material, so as to remove the amorphous semiconductor material in the at least one volume implanted with the plurality of ions while maintaining the structure of the crystalline semiconductor material outside the at least one ion implanted volume
    wherein
    the implanting is performed over a depth of the semiconductor material between L1 and L2, where L1 is a distance between the surface of the absorption layer and a highest peak of reliefs of the surface roughness of the layer of semiconductor material, and where L2 is the distance between the surface of the absorption layer and a deepest valley of reliefs of the surface roughness of the layer of semiconductor material,
    the crystalline semiconductor material forms a layer extending in a plane, and
    the ion implanting is performed in at least two opposite directions $+\alpha$ and $-\alpha$ of inclination relative to the perpendicular to said plane.

2. The method according to claim 1, wherein the implanting is performed in such a manner that all of the crystalline semiconductor material that is situated above said depth is implanted and made amorphous, and in such a manner as to keep in the crystalline state the semiconductor material that is situated below said depth.

3. The method according to claim 1, further comprising, prior to the implanting, depositing a mask that blocks the implanting at least in part.

4. The method according to claim 1, wherein $90°>\alpha>0°$.

5. The method according to claim 3, wherein the direction and the depth of the implanting are defined in such a manner that the implanted volumes meet under at least one relief carried by the mask, thereby forming a cavity under said relief.

6. The method according to claim 1, wherein, prior to the implanting, the following are performed:
    forming a stack comprising, in succession, a base substrate forming the crystalline semiconductor to be etched, an insulating layer, a semiconductive surface layer, an insulating layer, and a protective layer resistant to the hydrogen chloride chemical etching;
    etching a trench through the insulating layer, through the semiconductive surface layer, through the insulating layer, and through the protective layer;
    forming spacers covering sides of the trench; the spacers being resistant to the hydrogen chloride chemical etching; and
    etching a cavity in the base substrate opposite the trench;
    wherein, the implanting is performed in the base substrate in at least two directions that are inclined relative to the perpendicular to the plane of the base substrate in such a manner as to amorphize the sides of the cavity etched in the base substrate;
    wherein said hydrogen chloride chemical etching is performed in such a manner as to widen the cavity in the substrate; and
    further comprising filling the trench and the cavity with an electrically insulating material so as to form an isolation trench.

7. The method according to claim 3, wherein the semiconductor material forms a surface layer of a stack of layers of a semiconductor on insulator (SOI) type.

8. The method according to claim 7, wherein the mask is configured to allow the implanting to pass through at level of a zone serving to form a gate or a transistor of a Field Effect Transistor (FET) type, and wherein the depth of the implanting is defined in such a manner that a portion of semiconductor material situated under the implanted zone defines a channel for the transistor.

9. The method according to claim 8, wherein the mask is configured to block the implanting on either side of said zone serving to form a gate for the transistor.

10. The method according to claim 8, the method being implemented to make a Field-Effect Transistor (FET) of a Fully Depleted Silicon On Insulator (FDSOI) type.

11. The method according to claim 3, wherein the semiconductor material forms at least part of an optical grating.

12. The method according to claim 1, wherein the chemical etching is performed at a temperature selected to at least reduce the recrystallization kinetics of the volume that is made amorphous.

13. The method according to claim 1, wherein the semiconductor material is homogeneous.

14. The method according to claim 1, wherein the semiconductor material is selected from the group consisting of: silicon, silicon-germanium (SiGe), silicon-phosphorus (SiP), silicon-carbon (SiC), and germanium (Ge).

15. The method according to claim 1, wherein the semiconductor material comprises silicon.

16. The method according to claim 1, wherein the semiconductor material comprises monocrystalline silicon.

17. The method according to claim 1, the method being implemented to make nanowires.

* * * * *